(12) United States Patent
Shim

(10) Patent No.: US 8,134,676 B2
(45) Date of Patent: Mar. 13, 2012

(54) DISPLAY APPARATUS HAVING A MAIN AND SUB FPC AND A RECEIVING CONTAINER WHICH RECEIVES THE MAIN AND SUB FPC

(75) Inventor: Byung-Chang Shim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 750 days.

(21) Appl. No.: 11/438,851

(22) Filed: May 23, 2006

(65) Prior Publication Data

US 2006/0264093 A1 Nov. 23, 2006

(30) Foreign Application Priority Data

May 23, 2005 (KR) .................. 10-2005-0043131

(51) Int. Cl.
 *G02F 1/1333* (2006.01)
 *G02F 1/1345* (2006.01)
(52) U.S. Cl. .......................................... 349/150; 349/58
(58) Field of Classification Search ............. 349/58–60, 349/150
 See application file for complete search history.

(56) References Cited

U.S. PATENT DOCUMENTS

| 7,233,382 B2 * | 6/2007 | Yamaji et al. ................. 349/150 |
| 2003/0067577 A1 * | 4/2003 | Yamada ........................ 349/150 |
| 2005/0068472 A1 * | 3/2005 | Sung et al. ..................... 349/64 |
| 2005/0190333 A1 * | 9/2005 | Wu et al. ....................... 349/150 |

FOREIGN PATENT DOCUMENTS

| JP | 2001-083902 A | 3/2001 |
| JP | 2003-092020 A | 3/2003 |
| JP | 2003-114433 A | 4/2003 |
| JP | 2004-004924 A | 1/2004 |
| JP | 2005-070774 A | 3/2005 |
| JP | 2005-115335 A | 4/2005 |
| JP | 2005099619 A | 4/2005 |

\* cited by examiner

*Primary Examiner* — Jessica M Merlin
(74) *Attorney, Agent, or Firm* — Cantor Colburn LLP

(57) ABSTRACT

A display apparatus includes a display panel, a light guiding unit, a main flexible printed circuit board (FPC) and a sub FPC. The light guiding unit is disposed adjacent to a first side of the display panel. The main FPC is electrically connected to a second side of the display panel to apply an electrical signal to the display panel. The sub FPC is electrically connected to the main FPC. A light emitting device generates light supplied to the light guiding unit, and is mounted on the sub FPC.

5 Claims, 11 Drawing Sheets

DISPLAY APPARATUS HAVING A MAIN AND SUB FPC AND A RECEIVING CONTAINER WHICH RECEIVES THE MAIN AND SUB FPC

This application claims priority to Korean Patent Application No. 2005-43131 filed on May 23, 2005, and all the benefits accruing therefrom under 35 U.S.C. §119, the contents of which are herein incorporated by reference in its entirety.

BACKGROUND OF THE INVENTION

1. Field of the Invention

The present invention relates to a display apparatus. More particularly, the present invention relates to a display apparatus that does not require soldering or connecting a sub flexible printed circuit board (FPC) for a light emitting diode (LED) to a main FPC.

2. Description of the Related Art

In general, a liquid crystal display (LCD) apparatus includes a liquid crystal display panel having an array substrate, a color filter substrate opposite to the array substrate, and a liquid crystal layer interposed between the array substrate and the color filter substrate.

In addition, the liquid crystal display apparatus includes a driving circuit part to drive the liquid crystal display panel and a backlight assembly to generate light. The driving circuit part applies data signals and gate signals to data lines and gate lines that are formed on the array substrate, respectively. The backlight assembly supplies the light to the liquid crystal display panel.

A method of electrically connecting the driving circuit part with the liquid crystal display panel may include a tape automated bonding (TAB) method and a chip on glass (COG) method. According to the TAB method, a driving chip, into which the driving circuit part is integrated is mounted on a film, is attached to the liquid crystal display panel, so that bumps or protrusions of the driving chip are electrically connected with pads of the liquid crystal display panel through leads formed on the film. However, according to the COG method, the driving chip is directly mounted on the array substrate of the liquid crystal display panel. A conventional liquid crystal display apparatus uses the TAB method having advantages, such as a high adhesion, a high improvability, etc. As mounting technology has been developed, the liquid crystal display apparatus using the COG method has an advantage, such as an easy downsizing, a low manufacturing cost, etc.

As mobile communication technology has been developed, the liquid crystal display apparatus is generally used as a terminal of the mobile communication. The liquid crystal display apparatus for the terminal of the mobile communication employs a light emitting diode (LED) as a light source. In addition, the liquid crystal display apparatus for the terminal of the mobile communication has a main flexible printed circuit (FPC) and a sub FPC. The main FPC applies a driving signal to the liquid crystal display panel, and the LED is mounted on the sub FPC.

A conventional liquid crystal display apparatus includes the main FPC electrically connected to the sub FPC via a soldering process or a connector.

However, since the main FPC has a small size, it is difficult to obtain a space on the FPC to mount bonding pads or the connector that ultimately is electrically connected to the sub FPC in the main FPC.

SUMMARY OF THE INVENTION

The present invention provides a display apparatus capable of simplifying a process of assembling a sub FPC with a LED and a main FPC.

In one exemplary embodiment of the present invention, a display apparatus includes a display panel, a light guiding unit, a main flexible printed circuit board (FPC), a sub FPC and a light emitting device. The light guiding unit is disposed on a first side of the display panel. The main FPC is electrically connected to a second side of the display panel to apply an electrical signal to the display panel. The sub FPC is electrically connected to the main FPC. The light emitting device generates light supplied to the light guiding unit, and is mounted on the sub FPC. The display panel comprises a conductive line electrically connecting the main FPC with the sub FPC.

In another exemplary embodiment of the present invention, a display apparatus includes a display panel, a light guiding unit, a main flexible printed circuit board (FPC), a sub FPC and a light emitting device. The light guiding unit is disposed on a first side of the display panel. The main FPC is electrically connected to a second side of the display panel to apply an electrical signal to the display panel. The sub FPC is electrically connected to the main FPC. The light emitting device generates light supplied to the light guiding unit, and is mounted on the sub FPC. The sub FPC is integrally formed with the main FPC and forming a single unit.

In another exemplary embodiment of the present invention, a display apparatus includes a liquid crystal display panel, a light guiding unit, a receiving container, a main FPC and a sub FPC. The liquid crystal display panel has a first substrate, a second substrate and a liquid crystal layer interposed between the first and second substrates. The light guide unit is disposed under the liquid crystal display panel. The receiving container receives the light guide unit. The main FPC is electrically connected to a first end of a conductive line formed on the liquid crystal display panel to apply an electrical signal to the liquid crystal display panel. The sub FPC is electrically connected to a second end of the conductive line. At least one light emitting device generates light supplied to the light guiding unit and is mounted on the sub FPC.

In another exemplary embodiment of the present invention, a display apparatus includes a liquid crystal display panel, a light guiding unit, a receiving container and an FPC. The light guide unit is disposed under the display panel. The receiving container receives the light guide unit. The FPC is electrically connected to the liquid crystal display panel. At least one driving chip applies an electrical signal to the liquid crystal display panel and is mounted on the FPC. At least one light emitting device generates light supplied to the light guide unit and is mounted on the FPC.

In another exemplary embodiment of the present invention, the sub FPC with the light emitting device is directly attached to the display panel and electrically connected to the main FPC via the conductive line formed on the display panel, thereby omitting a process of soldering or connecting the sub FPC to the main FPC.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Figure 1:
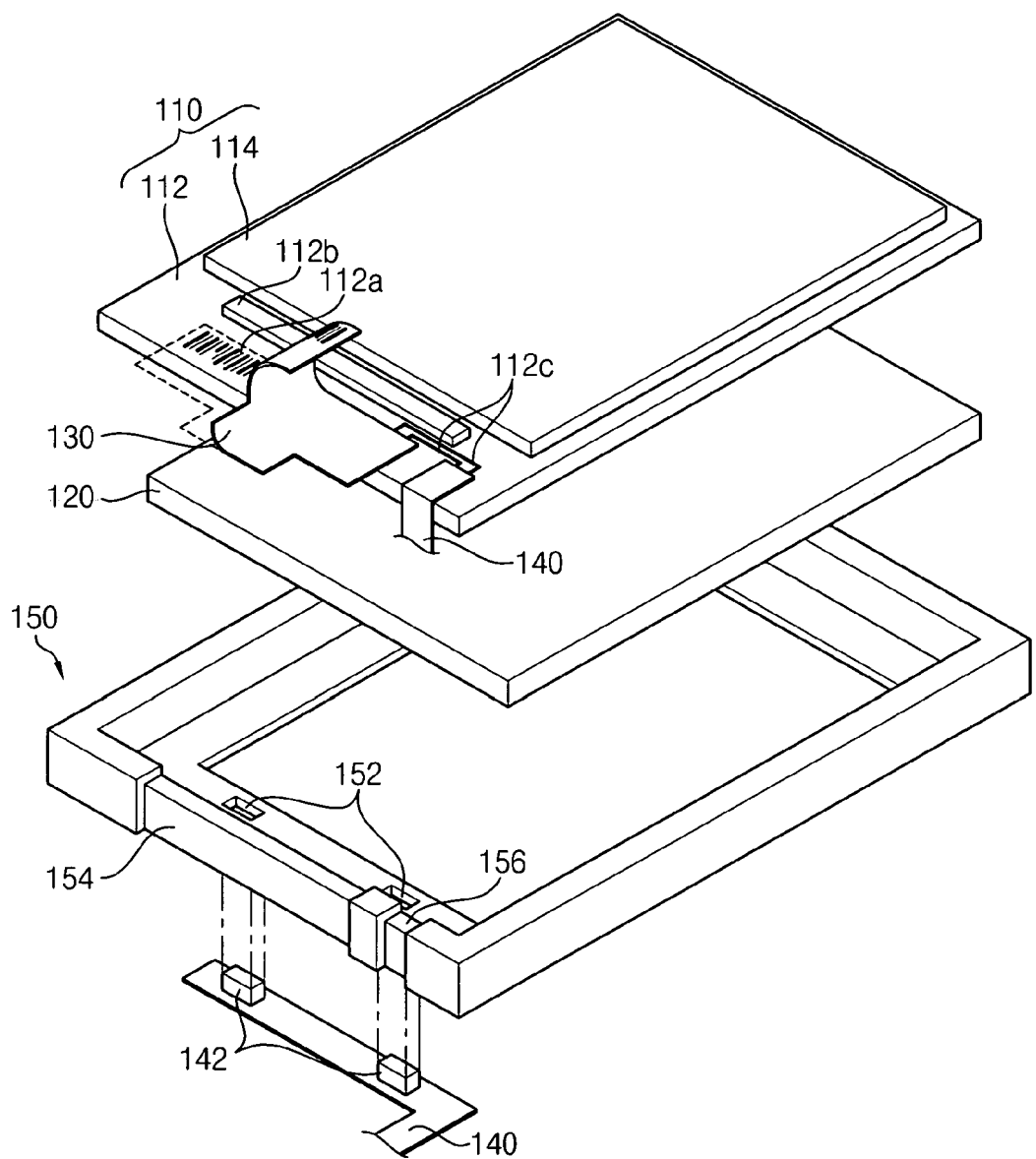
FIG. 1 is an exploded perspective view showing an exemplary embodiment of a display apparatus according to the present invention.

The invention is described more fully hereinafter with reference to the accompanying drawings, in which embodiments of the invention are shown.

This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is an exploded perspective view showing an exemplary embodiment of a display apparatus according to the present invention.

Referring to FIG. 1, a display apparatus 100 includes a display panel 110, a light guiding plate 120, a main flexible printed circuit board (FPC) 130, a sub FPC 140 and a receiving container 150.

The display panel 110 has an array substrate 112, a color filter substrate 114 opposite to the array substrate 112 and a liquid crystal layer (not shown) interposed between the array substrate 112 and the color filter substrate 114.

The array substrate 112 includes a plurality of thin film transistors (not shown) that are formed on a first base substrate (not shown) in a matrix shape. In exemplary embodiments, the first base substrate includes a glass material. Each of the thin film transistors has a source terminal connected to a data line and a gate terminal connected to a gate line and a drain terminal connected to a pixel electrode (not shown). In other exemplary embodiments, the pixel electrode includes a transparent and conductive material.

Referring to FIG. 1, the array substrate 112 includes a first conductive line 112a and a second conductive line 112c. The first conductive line 112a is formed in a first portion of a peripheral area of the array substrate 112, and the second conductive line 112c is formed in a second portion of the peripheral area adjacent to the first portion. A driving chip 112b, such as a data driving chip, is mounted in a third portion of the peripheral area of the array substrate 112. The first conductive line 112a electrically connects the main FPC 130 with the driving chip 112b, and the second conductive line 112c electrically connects the sub FPC 140 with the main FPC 130.

The color filter substrate 114 includes a plurality of RGB pixels (not shown) to display colors. The RGB pixels are formed on a second base substrate (not shown) in a thin film-shape. In exemplary embodiments, the second base substrate includes glass material. The color filter substrate 114 may include a common electrode formed on the RGB pixels. The common electrode may include a transparent and conductive material.

In the display panel 110, the TFT is turned-on in response to a power applied to the gate terminal of the TFT, so that an electric field is formed between the pixel electrode and the common electrode. The liquid crystal layer includes a plurality of liquid crystal molecules that are aligned between the array substrate 112 and the color filter substrate 114. As the alignment of the liquid crystal molecules is varied by the electric field, a transmittance of light passing through the liquid crystal layer is controlled. Thus, the display panel may display images having a desired gray scale using the light.

The light guide plate 120 is disposed under the display panel 110. Although not shown in FIG. 1, an optical sheet may be disposed between the light guide plate 120 and the display panel 110. The optical sheet may include, but is not limited to, a diffusing sheet, a prism sheet and a protecting sheet. The light guide plate 120 may include a light incident surface and a light transmittance surface.

In exemplary embodiments, the main FPC 130 is attached to a lower end portion of the array substrate 112 via a film on glass (FOG) bonding process, and applies an electrical signal generated by a control printed circuit board (PCB) (not shown) to the driving chip 112b through the first conductive line 112a. An anisotropic conductive film (ACF) (not shown) is disposed between the main FPC 130 and the array substrate 112, and electrically connects the main FPC 130 and the array substrate 112 via a pressure process. The lower end portion of the array substrate 112 where the main FPC 130 is attached may correspond to a light incident surface portion of the light guide plate 120.

In an exemplary embodiment of a method of manufacturing a LCD display apparatus, once the main FPC 130 is attached to the array substrate 112 via the FOG bonding process, the array substrate 112 is received in the receiving container 150. In alternative exemplary embodiments, after the main FPC 130 is attached to the array substrate 112 via the FOG bonding process, the array substrate 112 and the main FPC 130 may be assembled with the receiving container 150.

In another exemplary embodiment of a LCD display apparatus, the control PCB (not shown) is disposed on a rear surface of the receiving container 150. The main FPC 130 may be electrically connected to the control PCB via a soldering process or an ACF bonding process. In alternative embodiments, the main FPC 130 may be electrically connected to the control PCB via a connector (not shown) that is disposed on the control PCB. In addition, at least one driving chip (not shown) to generate the electric signal applied to the display panel 110 may be mounted on the main FPC 130.

Referring to FIG. 1, the sub FPC 140 is attached to the lower end portion of the display panel 110 via the FOG bonding process, and electrically connected to the main FPC 130 through the second conductive line 112c that is formed on the array substrate 112. At least one light emitting device 142 to supply light to the light guiding plate 120 is mounted on the sub FPC 140.

In an exemplary embodiment as illustrated in FIG. 1, the display device may be substantially frame shaped. For orientation purposes, a Cartesian coordinate system may be used where a first side of the display device extends along a Y-axis direction, and a second side of the display device extends along an X-axis direction, where the Y-axis is substantially perpendicular to the X-axis and a Z-axis direction is substantially perpendicular to both the X and Y axes.

The receiving container 150 has a sidewall extending from a bottom (or rear side) portion of the receiving container 150 in a Z-direction. The sidewall may extend substantially in a X-direction and Y-direction. A supporting portion is extended from a bottom portion of the sidewall toward an inside of the receiving container 150 substantially in a Y-direction, an X-direction or both. The light guiding plate 120 and the display panel 110 are received in a receiving space that is formed by the sidewall and the supporting portion. In exemplary embodiments, the receiving container 150 includes a plastic material (hereinafter, referred to as "heatsink plastic") having a thermal conductivity of more than about twenty (20) W/(m*K). The heatsink plastic may include, but is not limited to, a Coolpoly™ (trade name produced by Cool Polymers Company in United States). The Coolpoly™ includes a plastic having a thermal conductivity of about ten (10) W/(m*K) to about one hundred (100) (W/m*k), wherein 'W' denotes watt, 'm' denotes meter, and 'K' denotes Kelvin scale.

At least one hole 152 is formed through the supporting portion, and the at least one light emitting device 142 mounted on the sub FPC 140 is inserted into the at least one hole 152. FIG. 1 illustrates two holes, but more or less may be used as is suitable for the purpose described herein.

The receiving container 150 has a first receiving portion 154 formed on a path through which the main FPC 130 passes and a second receiving portion 156 formed on a path through which the sub FPC 140 passes. The first and second receiving portions 154 and 156 are formed by partially removing the sidewall of the receiving container 150 corresponding to the main and sub FPCs 130 and 140, respectively.

The first receiving portion 154 guides a receiving position of the main FPC 130 bent to the control PCB disposed on the rear surface of the receiving container 150, and the second receiving portion 156 guides a receiving position of the sub FPC 140 bent to the rear surface of the receiving container 150. As the main FPC 130 and the sub FPC 140 are bent to the rear surface of the receiving container 150, they cover a portion of an end side of the display panel 110. In other exemplary embodiments, the main FPC 130, the sub FPC 140 or both may also cover a light incident surface portion of the light guide plate 120 as they are bent to the rear surface of the receiving container 150.

In FIG. 1, the receiving container 150 having the first and second receiving portions 154 and 156 to guide the main and sub FPCs 130 and 140 has been described. In alternative exemplary embodiments, the display apparatus 100 may not require both the first and second receiving portions 154 and 156.

Figure 2:
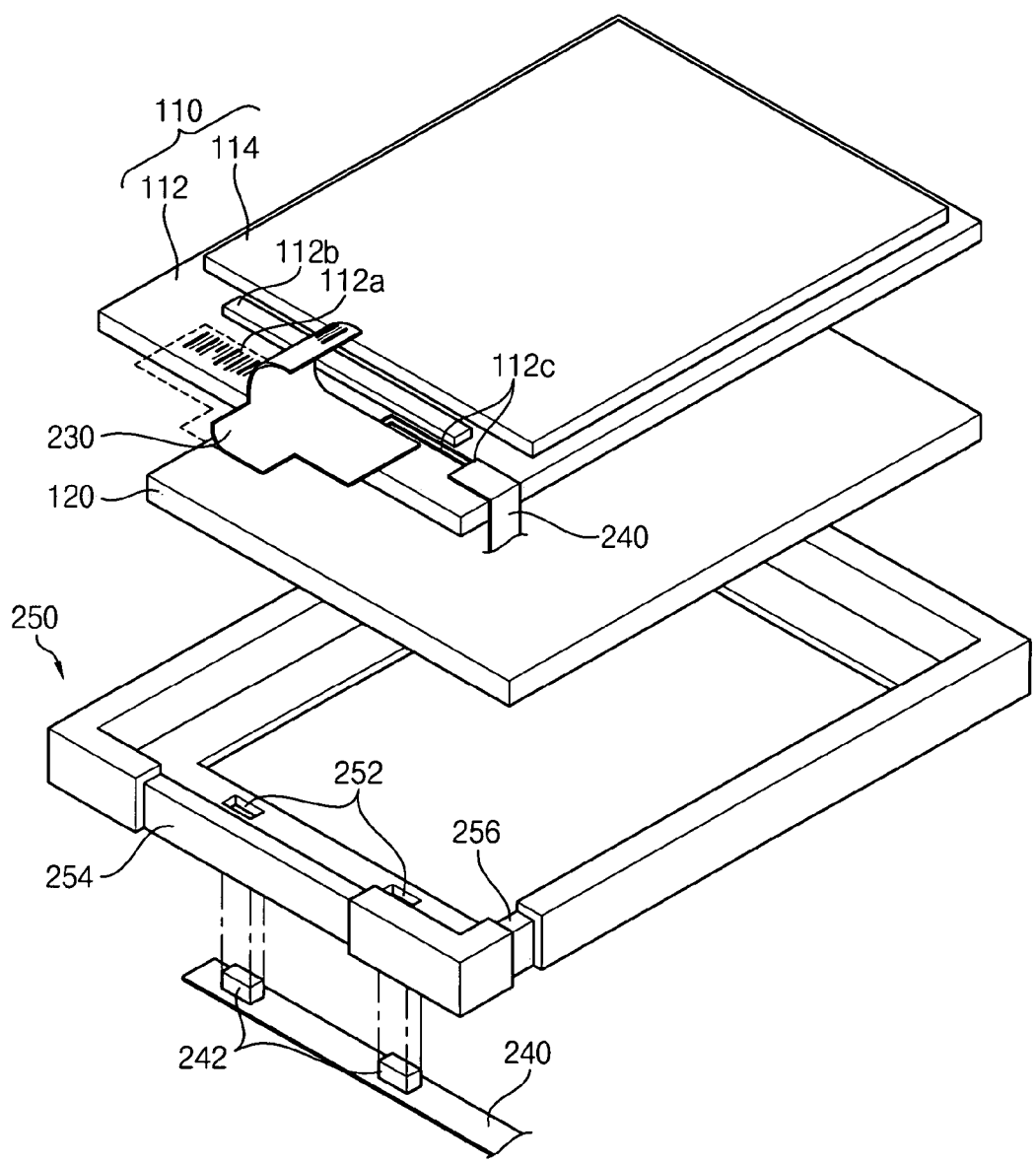
FIG. 2 is an exploded perspective view showing another exemplary embodiment of a display apparatus according to the present invention.

FIG. 2 is an exploded perspective view showing an exemplary embodiment of a display apparatus according to the present invention. In FIG. 2, a sub FPC 240 is attached to a right side portion of the display panel 110 via the FOG bonding process.

Referring to FIG. 2, an exemplary embodiment of a display apparatus 200 according to the present invention includes the display panel 110, the light guide plate 120, a main FPC 230, a sub FPC 240 and a receiving container 250. In FIG. 2, the same reference numerals denote the same elements in FIG. 1, and thus any further repetitive descriptions of the same elements will be omitted.

The main FPC 230 is attached to a lower end portion of the array substrate 112 via the FOG bonding process, and applies an electrical signal generated by a control PCB (not shown) to the driving chip 112b through the first conductive line 112a. The control PCB is disposed on a rear surface of the receiving container 250. The main FPC 230 may be electrically connected to the control PCB via a soldering process or the ACF bonding process. Alternatively, the main FPC 230 may be electrically connected to the control PCB via a connector that is disposed on the control PCB. In addition, at least one driving chip to generate the electric signal applied to the display panel 110 may be mounted on the main FPC 230.

The sub FPC 240 is attached to the right side portion of the display panel 110 via the FOG bonding process, and electrically connected to the main FPC 230 through the second conductive line 112c that is formed on the array substrate 112. At least one light emitting device 242 to supply light to the light guiding plate 120 is mounted on the sub FPC 240.

The receiving container 250 has a sidewall and a supporting portion extended from a bottom portion of the sidewall toward an inside of the receiving container 250. The light guiding plate 120 and the display panel 110 are received in a receiving space that is formed by the sidewall and the supporting portion. At least one hole 252 is formed through the supporting portion, and the at least one light emitting device 242 mounted on the sub FPC 240 is inserted into the at least one hole 252.

The receiving container 250 has a first receiving portion 254 formed on a path through which the main FPC 230 passes and a second receiving portion 256 formed on a path through which the sub FPC 240 passes. The first and second receiving portions 254 and 256 are formed by partially removing the sidewall of the receiving container 250 corresponding to the main and sub FPCs 230 and 240, respectively.

The first receiving portion 254 guides a receiving position of the main FPC 230 bent to the control PCB disposed on the rear surface of the receiving container 250, and the second receiving portion 256 guides a receiving position of the sub FPC 240 bent to the rear surface of the receiving container 250. As the main FPC 230 is bent to the rear surface of the receiving container 250, it covers a portion of an end side of the display panel 110. As the sub FPC 240 is bent to the rear surface of the receiving container 250, it covers a portion of a right end side of the display panel 110. In other exemplary embodiments, the main FPC 230, the sub FPC 240 or both may also cover a light incident surface portion of the light guide plate 120 as they are bent to the rear surface of the receiving container 250.

In FIG. 2, the receiving container 250 having the first and second receiving portions 254 and 256 to guide the main and sub FPCs 230 and 240 has been described. In alternative exemplary embodiments, the display apparatus 200 may not require both the first and second receiving portions 254 and 256.

Figure 3:
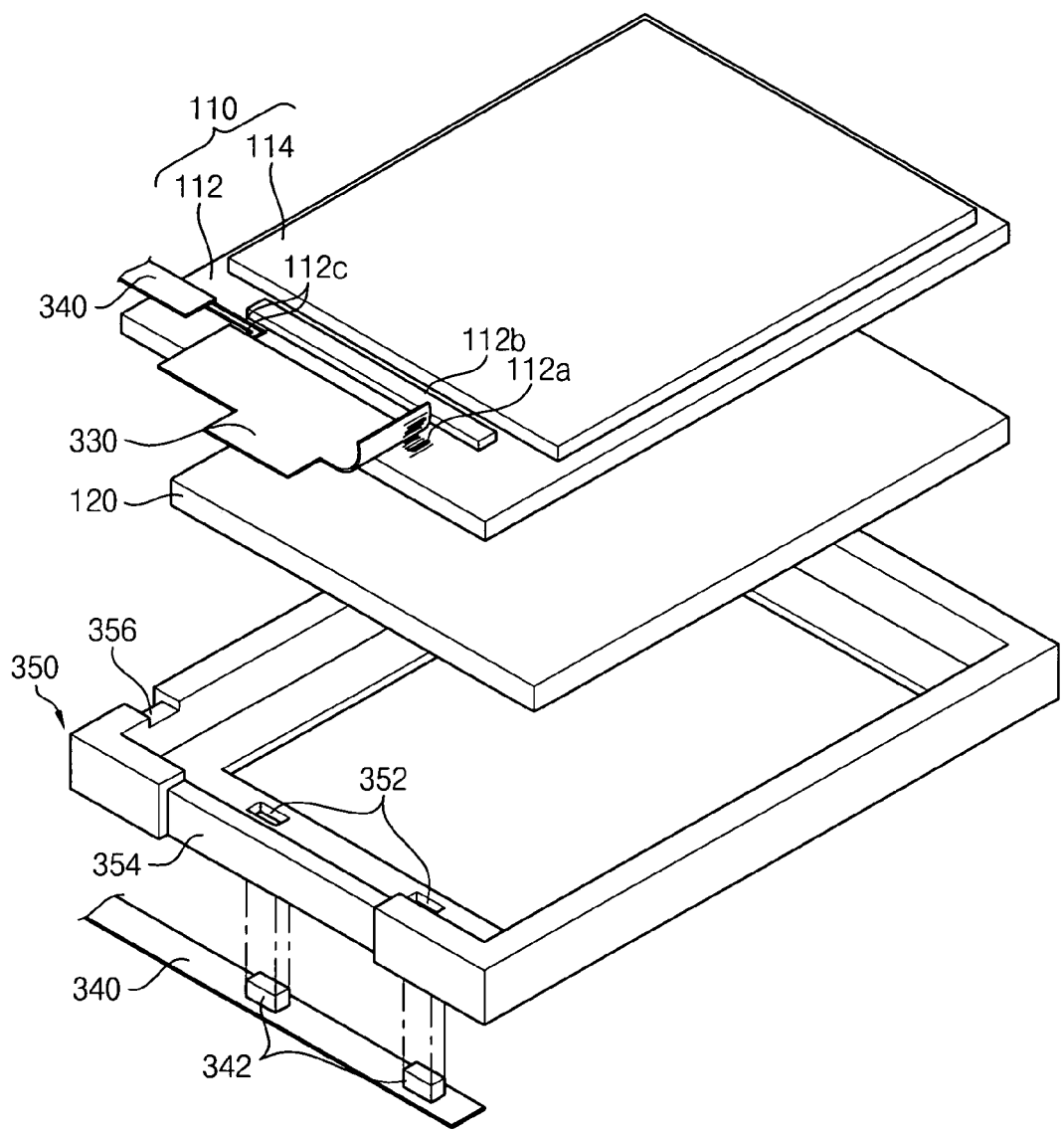
FIG. 3 is an exploded perspective view showing another exemplary embodiment of a display apparatus according to the present invention.

FIG. 3 is an exploded perspective view showing an exemplary embodiment of a display apparatus according to the present invention. In FIG. 3, a sub FPC 340 is attached to a left side portion of the display panel 110 via the FOG bonding process.

Referring to FIG. 3, an exemplary embodiment of a display apparatus according to the present invention includes the display panel 110, the light guiding plate 120, a main FPC 330, a sub FPC 340 and a receiving container 350. In FIG. 3, the same reference numerals denote the same elements in FIG. 1, and thus any further repetitive descriptions of the same elements will be omitted.

The main FPC 330 is attached to a lower end portion of the array substrate 112 via the FOG bonding process, and applies an electrical signal generated by the control PCB (not shown) to the driving chip 112b through the first conductive line 112a. The control PCB is disposed on a rear surface of the receiving container 350. The main FPC 230 may be electrically connected to the control PCB via a soldering process or the ACF bonding process. In alternative exemplary embodiments, the main FPC 330 may be electrically connected to the control PCB via a connector that is disposed on the control PCB. In addition, at least one driving chip to generate the electric signal applied to the display panel 110 may be mounted on the main FPC 330.

The sub FPC 340 is attached to the left side portion of the display panel 110 via the FOG bonding process, and electrically connected to the main FPC 330 through the second conductive line 112c that is formed on the array substrate 112. At least one light emitting device 342 to supply light to the light guiding plate 120 is mounted on the sub FPC 340.

The receiving container 350 has a sidewall and a supporting portion extended from a bottom portion of the sidewall toward an inside of the receiving container 350. The light guiding plate 120 and the display panel 110 are received in a receiving space that is formed by the sidewall and the supporting portion. At least one hole 352 is formed through the supporting portion, and the at least one light emitting device 342 mounted on the sub FPC 340 is inserted into the at least one hole 352.

The receiving container 350 has a first receiving portion 354 formed on a path through which the main FPC 330 passes and a second receiving portion 356 formed on a path through which the sub FPC 340 passes. The first and second receiving portions 354 and 356 are formed by partially removing the sidewall of the receiving container 350 corresponding to the main and sub FPCs 330 and 340, respectively.

The first receiving portion 354 guides a receiving position of the main FPC 330 bent to the control PCB disposed on the rear surface of the receiving container 350, and the second receiving portion 356 guides a receiving position of the sub FPC 340 bent to the rear surface of the receiving container 350. As the main FPC 330 is bent to the rear surface of the receiving container 350, it covers a portion of an end side of the display panel 110. As the sub FPC 340 is bent to the rear surface of the receiving container 350, it covers a portion of a left end side of the display panel 110. In other exemplary embodiments, the main FPC 330, the sub FPC 340 or both may also cover a light incident surface portion of the light guide plate 120 as they are bent to the rear surface of the receiving container 350.

FIG. 3 shows the receiving container 350 having the first and second receiving portions 354 and 356 to guide the main and sub FPCs 330 and 340. In alternative exemplary embodiments, the display apparatus 300 may not require both the first and second receiving portions 354 and 356.

According to FIGS. 1, 2 and 3, the display apparatuses 100, 200 and 300 have the main FPCs 130, 230 and 330 and the sub FPCs 140, 240 and 340 separated from the main FPCs 130, 230 and 330. In alternative exemplary embodiments according to the present invention, a display apparatus having a hybrid type FPC into which the main FPC and the sub FPC are integrated may be used and is described below with reference to FIGS. 4, 5A and 5B.

Figure 4:
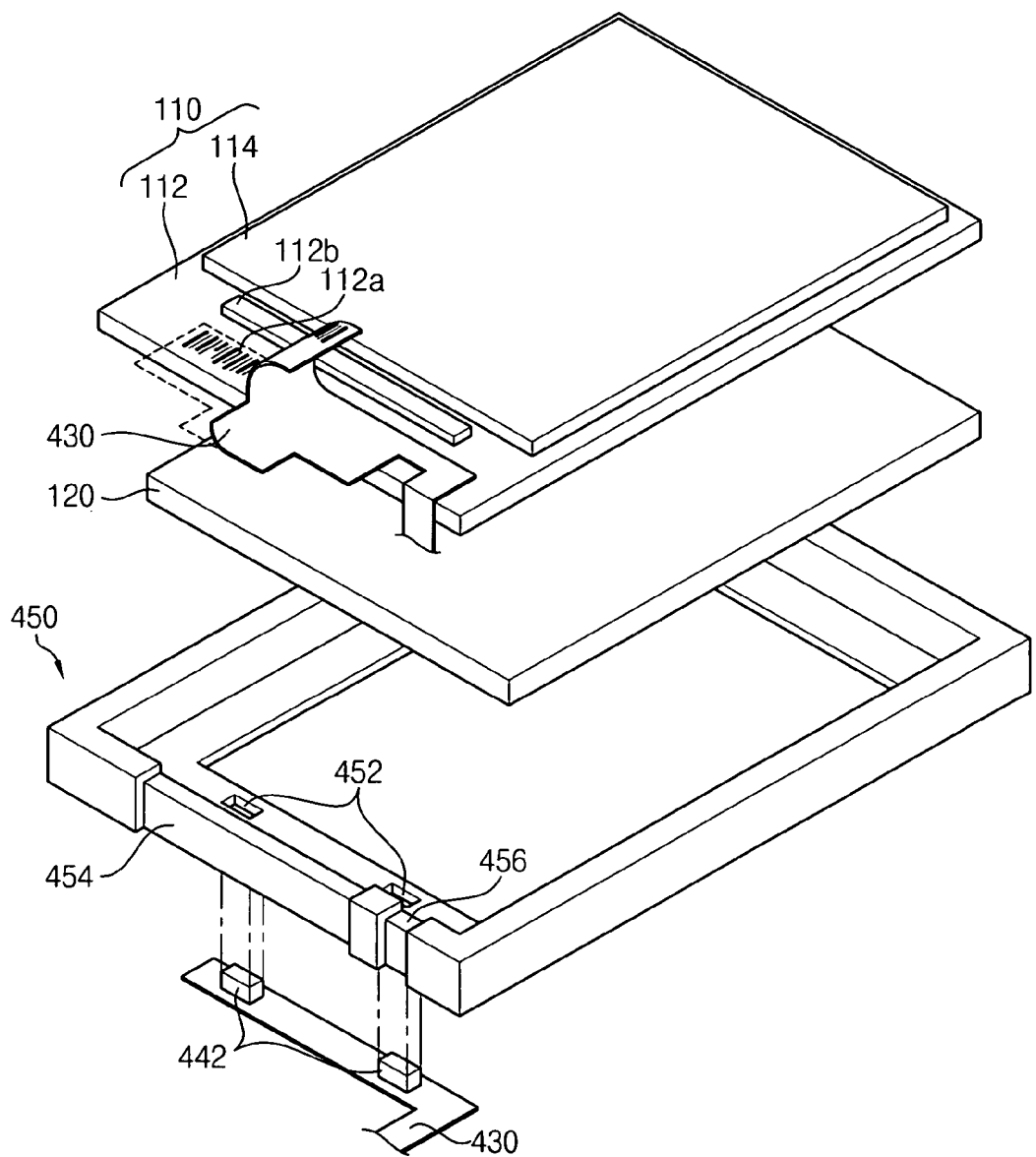
FIG. 4 is an exploded perspective view showing another exemplary embodiment of a display apparatus according to the present invention.
Figure 5A:
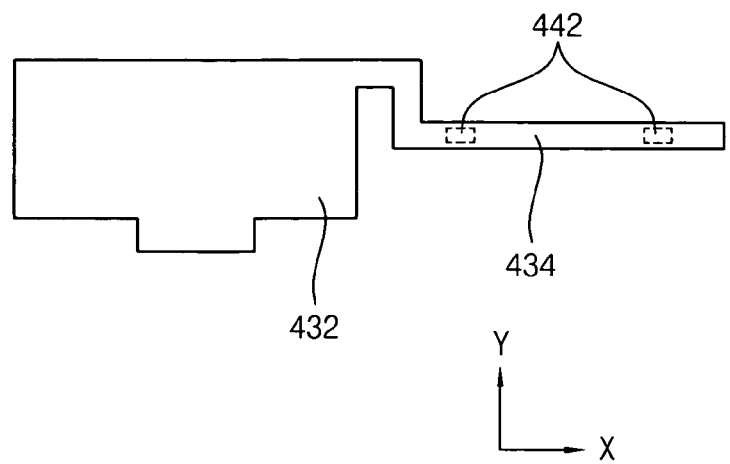
FIG. 5A is a plan view showing an exemplary embodiment of a hybrid FPC in FIG. 4.
Figure 5B:
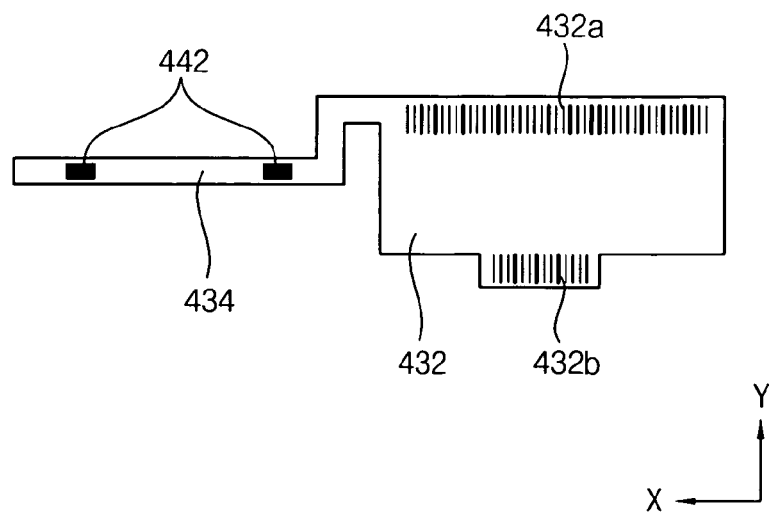
FIG. 5B is a rear view showing the hybrid FPC in FIG. 5A.

FIG. 4 is an exploded perspective view showing an exemplary embodiment of a display apparatus according to the present invention. FIG. 5A is a plan view showing an exemplary embodiment of a hybrid FPC in FIG. 4. FIG. 5B is a rear view showing the hybrid FPC in FIG. 5A. Particularly, FIG. 4 shows a hybrid FPC attached to an end portion of the display panel 110.

Referring to FIGS. 4, 5A and 5B, an exemplary embodiment of a display apparatus 400 according to the present invention includes the display panel 110, the light guide plate 120, the hybrid FPC 430 and a receiving container 450. In FIGS. 4, 5A and 5B, the same reference numerals denote the same elements in FIG. 1, and thus any further repetitive descriptions of the same elements will be omitted.

The hybrid FPC 430 includes a main portion 432 and a sub portion 434.

The main portion 432 is attached to a lower end portion of the array substrate 112 via the FOG bonding process, and applies an electrical signal generated by the control PCB (not shown) to the driving chip 112b through the first conductive line 112a. The control PCB is disposed on a rear surface of the receiving container 450. The hybrid FPC 430 may be electrically connected to the control PCB via a soldering process or the ACF bonding process. In alternative embodiments, the hybrid FPC 430 may be electrically connected to the control PCB via a connector that is disposed on the control PCB. In other alternative exemplary embodiments, at least one driving chip to generate the electric signal applied to the display panel 110 may be mounted on the main portion 432 of the hybrid FPC 430. The lower end portion of the array substrate 112 where the hybrid FPC 430 is attached may correspond to a light incident surface portion of the light guide plate 120.

As shown in FIG. 5B, the main portion 432 has a first pad portion 432a and a second pad portion 432b that are formed on a rear surface of the main portion 432. The first pad portion 432a is electrically connected to the array substrate 112, and the second pad portion 432b is electrically connected to the control PCB.

At least one light emitting device 442 to supply light to the light guiding plate 120 is mounted on the sub portion 434.

The receiving container 450 has a sidewall and a supporting portion extended from a bottom portion of the sidewall toward an inside of the receiving container 450. The light guiding plate 120 and the display panel 110 are received in a receiving space that is formed by the sidewall and the supporting portion. At least one hole 452 is formed through the supporting portion, and the at least one light emitting device 442 mounted on the hybrid FPC 430 is inserted into the at least one hole 452.

The receiving container 450 has a first receiving portion 454 formed on a path through which the main portion 432 of the hybrid FPC 430 passes and a second receiving portion 456 formed on a path through which the sub portion 434 of the hybrid FPC 430 passes. The first and second receiving portions 454 and 456 essentially receive the main portion 432 and the sub portion 434 as they pass over the corresponding sidewall of the receiving container. The first and second receiving portions 454 and 456 are formed by partially removing the sidewall of the receiving container 450 corresponding to the main and sub portions 432 and 434, respectively.

The first receiving portion 454 guides a receiving position of the main portion 432 bent to the control PCB disposed on the rear surface of the receiving container 450, and the second receiving portion 456 guides a receiving position of the sub portion 434 bent to the rear surface of the receiving container 450. As the main portion 432 and the sub portion 434 are bent to the rear surface of the receiving container 450, they cover a portion of a side of the display panel 110. In other exemplary embodiments, the main portion 432, the sub portion 434 or both may also be disposed adjacent to the light incident surface of the light guide plate 120 as they are bent to the rear surface of the receiving container 450.

FIG. 4 shows the receiving container 450 having the first and second receiving portions 454 and 456 to guide the main and sub portions 432 and 434. In alternative exemplary embodiments, the display apparatus 400 may not require both the first and second receiving portions 454 and 456.

In FIG. 4, the hybrid FPC 430 is illustrated to be a substantially flat-type, sheet shape. The main and sub portions 432 and 434 are integrally formed with each other such that the hybrid FPC 430 is a single unit including the main and sub portions 432 and 434. In order to insert the light emitting device 442 mounted on the sub portion 434 into the hole 452, a bending process to bend the sub portion 434 of the hybrid FPC 430 toward the rear surface of the receiving container 450 may be needed.

FIGS. 6A to 6D are perspective views illustrating exemplary embodiments of a bending process of the hybrid FPC 430 in FIG. 4. In FIGS. 6A to 6D, the array substrate and the receiving container attached to the hybrid FPC via the FOG bonding process are omitted.

Figure 6A:
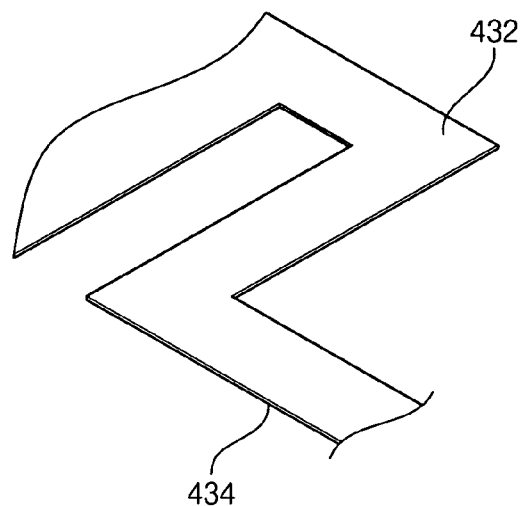
FIGS. 6A to 6D are perspective views illustrating exemplary embodiments of a bending process of the hybrid FPC in FIG. 4.

Referring to FIGS. 4 and 6A, the hybrid FPC 430 is electrically connected to a lower end portion of the array substrate 112 via the FOG bonding process. The hybrid FPC 430 and a front face of the array substrate 112 are substantially in parallel with an X-Y plane.

Figure 6B:
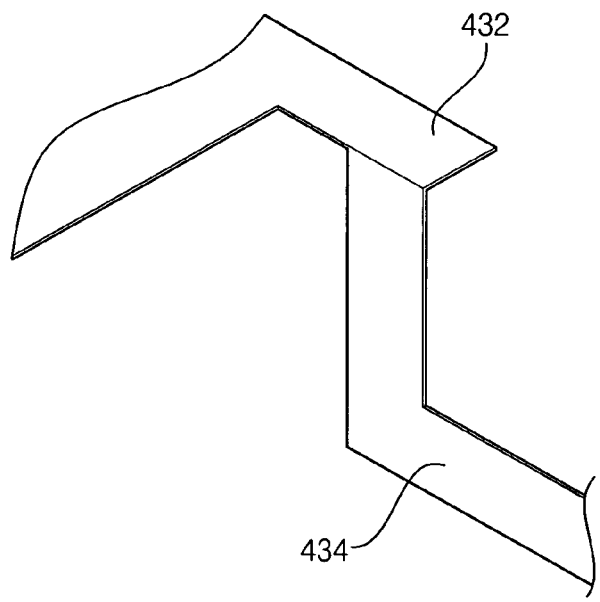

As shown in FIGS. 4 and 6B, the sub portion 434 extended in an Y-axis direction in FIG. 6A is bent along the main portion 432 in a Z-axis direction at an upper side of the sidewall of the receiving container 450, so that the sub portion 434 is substantially in parallel with an X-Z plane. In exemplary embodiments, the X-Z plane may correspond to a light incident portion of the light guide plate 120. Then, in FIG. 6C, the sub portion 434 extended in an X-axis direction is bent in an Y-axis direction at a lower side of the sidewall.

Figure 6C:
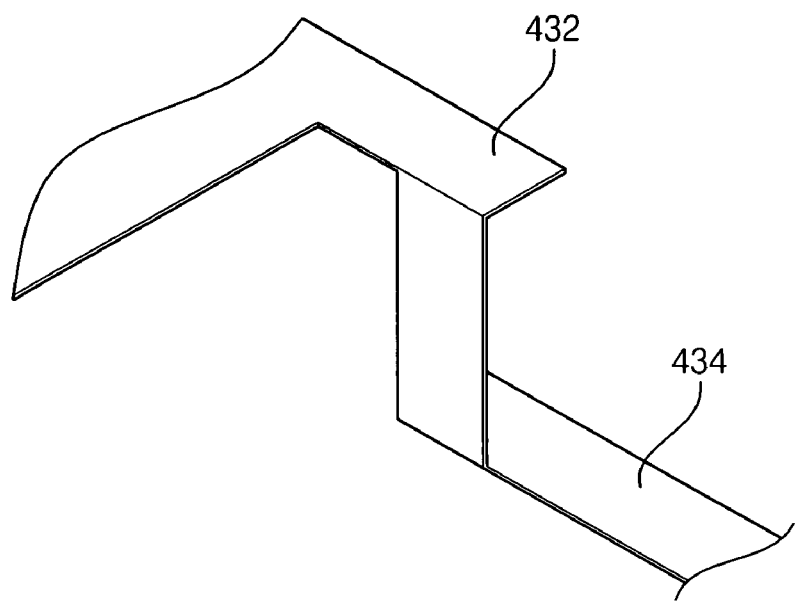
Figure 6D:
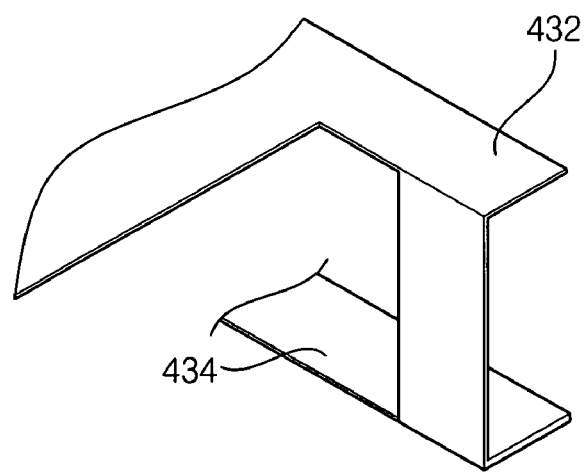

As shown in FIGS. 4 and 6D, the sub portion 434 extended in an X-axis direction is bent in a reversed X-axis direction opposite to the X-axis direction of FIGS. 6A-6C. Once the hybrid FPC 430 is bent as described in FIG. 6a-6D, the light emitting device 442 mounted on the sub portion 434 is received in the hole 452 formed through the supporting portion of the receiving container 450.

Figure 7:
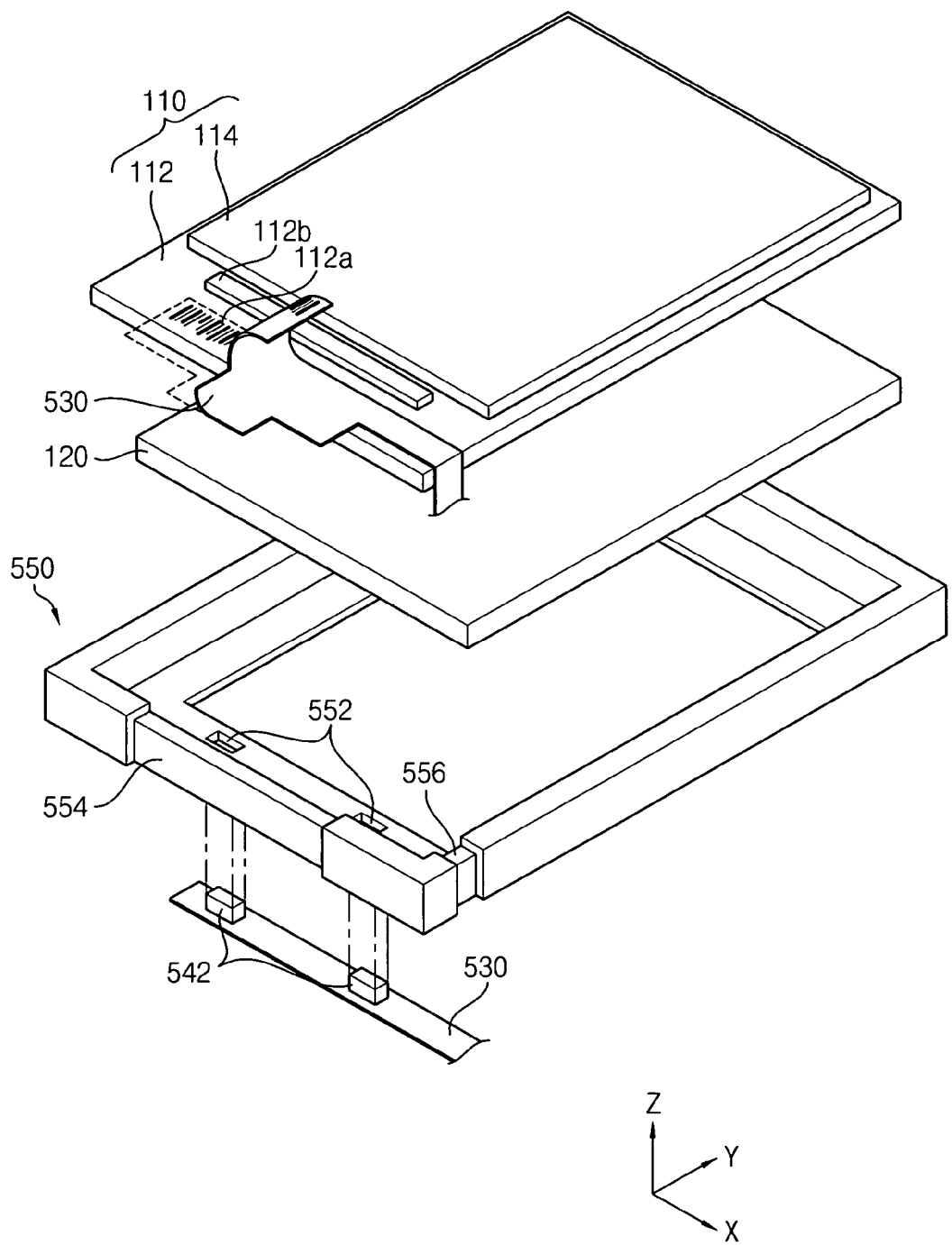
FIG. 7 is an exploded perspective view showing an exemplary embodiment of a display apparatus according to the present invention.
Figure 8A:
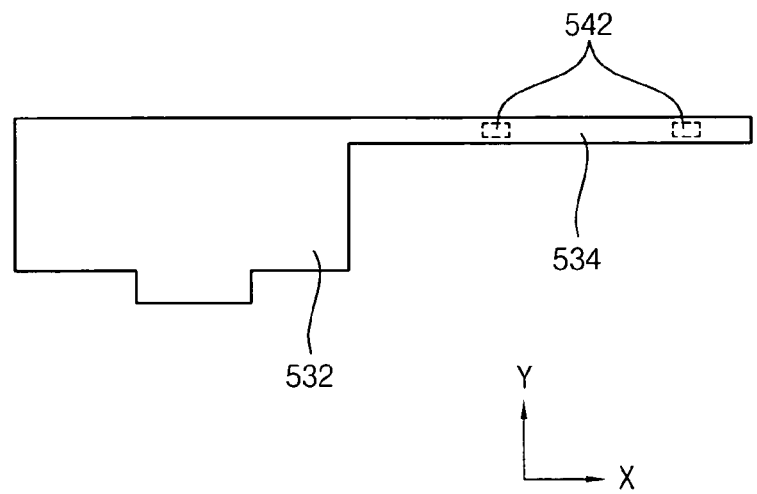
FIG. 8A is a plan view showing an exemplary embodiment of a hybrid FPC in FIG. 7.
Figure 8B:
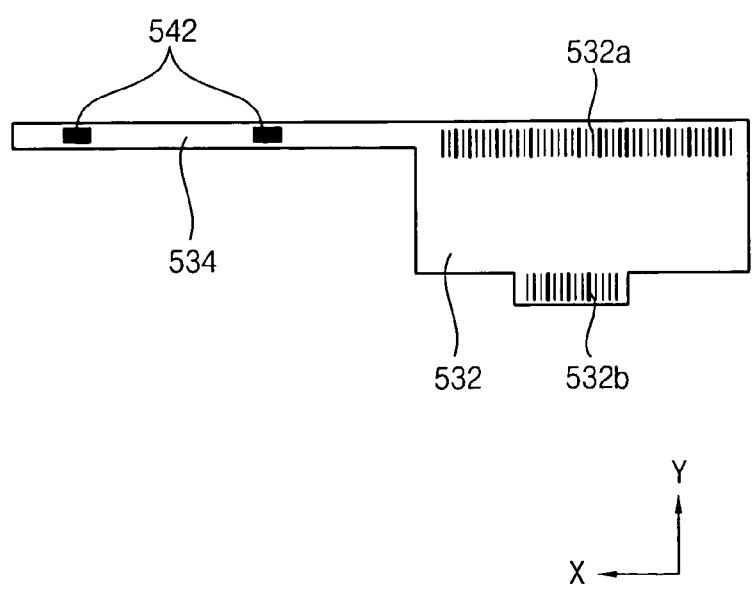
FIG. 8B is a rear view showing the hybrid FPC in FIG. 8A.

FIG. 7 is an exploded perspective view showing an exemplary embodiment of a display apparatus according to the present invention. FIG. 8A is a plan view showing an exemplary embodiment of a hybrid FPC in FIG. 7. FIG. 8B is a rear view showing the hybrid FPC in FIG. 8A. Particularly, FIG. 7 shows a hybrid FPC attached to a right side portion of the display panel.

Referring to FIGS. 7, 8A and 8B, an exemplary embodiment of a display apparatus 500 according to the present invention includes the display panel 110, the light guiding plate 120, the hybrid FPC 530 and a receiving container 550. In FIGS. 7, 8A and 8B, the same reference numerals denote the same elements in FIG. 1, and thus any further repetitive descriptions of the same elements will be omitted.

The hybrid FPC 530 includes a main portion 532 and a sub portion 534.

The main portion 532 is attached to a lower end portion of the array substrate 112 via the FOG bonding process, and applies an electrical signal generated by the control PCB (not shown) to the driving chip 112b through the first conductive line 112a. The control PCB is disposed on a rear surface of the receiving container 550. The hybrid FPC 530 may be electrically connected to the control PCB via a soldering process or an ACF bonding process. In alternative exemplary embodiments, the hybrid FPC 530 may be electrically connected to the control PCB via a connector that is disposed on the control PCB. In other exemplary embodiments, at least one driving chip to generate the electric signal applied to the display panel 110 may be mounted on the main portion 532.

As shown in FIG. 8B, the main portion 532 has a first pad portion 532a and a second pad portion 532b that are formed on a rear surface of the main portion 532. The first pad portion 532a is electrically connected to the array substrate 112, and the second pad portion 532b is electrically connected to the control PCB.

At least one light emitting device 542 is mounted on the sub portion 534 to supply light to the light guiding plate 120.

The receiving container 550 has a sidewall and a supporting portion extended from a bottom portion of the sidewall toward an inside of the receiving container 550. The light guiding plate 120 and the display panel 110 are received in a receiving space that is formed by the sidewall and the supporting portion. At least one hole 552 is formed through the supporting portion, and the at least one light emitting device 542 mounted on the hybrid FPC 530 is inserted into the at least one hole 552.

The receiving container 550 has a first receiving portion 554 formed on a path through which the main portion 532 of the hybrid FPC 530 passes and a second receiving portion 556 formed on a path through which the sub portion 534 of the hybrid FPC 530 passes. The first receiving portion 554 is formed by partially removing a side portion of the sidewall of the receiving container 550 corresponding to the main portion 532, and the second receiving portion 556 is formed by partially removing a right side portion of the sidewall corresponding to the sub portion 534.

The first receiving portion 554 guides a receiving position of the main portion 532 bent to the control PCB disposed on the rear surface of the receiving container 550, and the second receiving portion 556 guides a receiving position of the sub portion 534 bent to the rear surface of the receiving container 550. As the main portion 532 is bent to the rear surface of the receiving container 550, it covers a portion of a side of the display panel 110. As the sub portion 534 is bent to the rear surface of the receiving container 550, it covers a portion of a right side of the display panel 110. In other exemplary embodiments, the main portion 532, the sub portion 534 or both may also be disposed adjacent to the light incident surface of the light guide plate 120 as they are bent to the rear surface of the receiving container 550.

FIG. 7 shows the receiving container 550 having the first and second receiving portions 554 and 556 to guide the main and sub portions 532 and 534. In alternative exemplary embodiments, the display apparatus 500 may not require both the first and second receiving portions 554 and 556.

Figure 9:
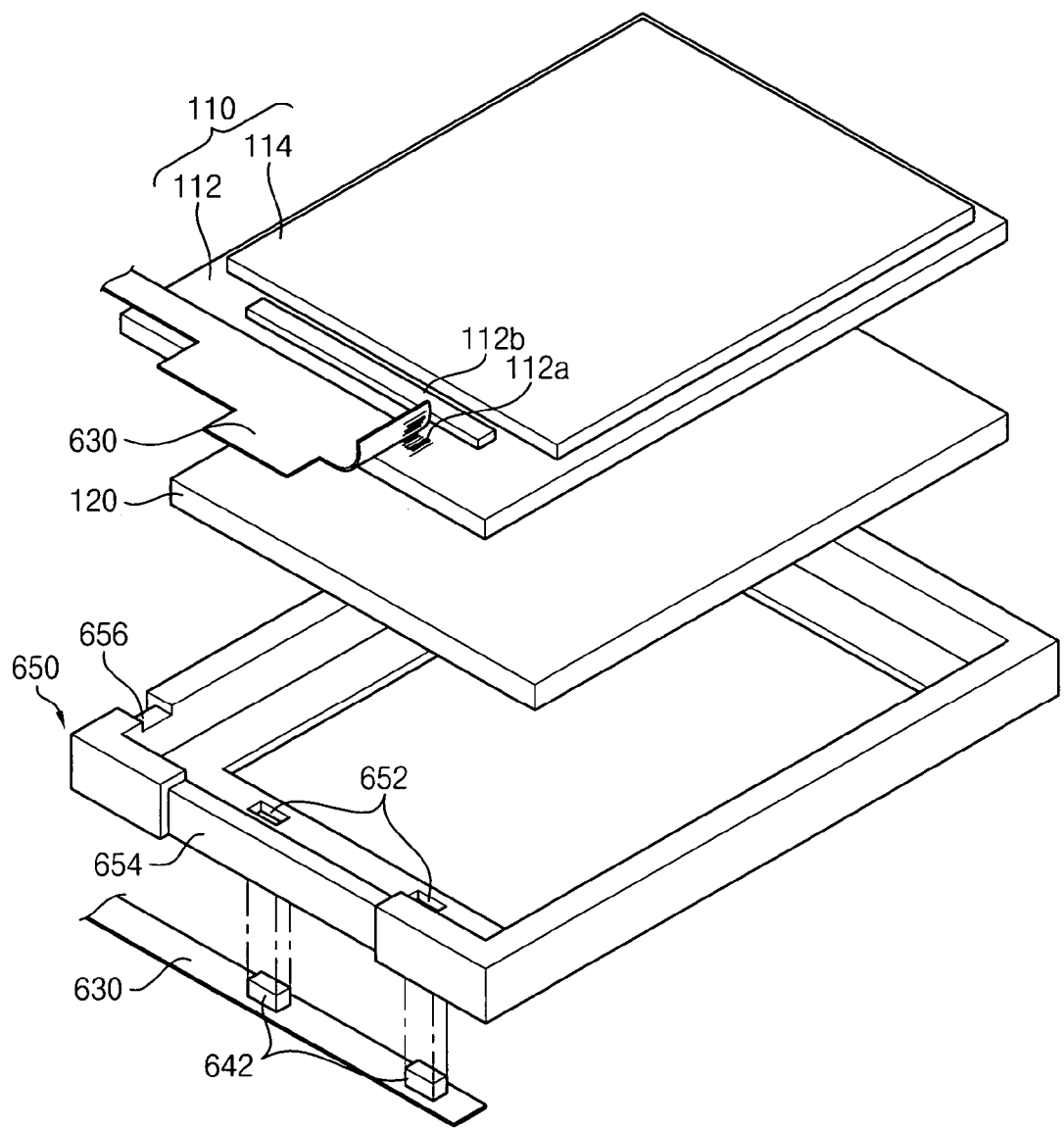
FIG. 9 is an exploded perspective view showing another exemplary embodiment of a display apparatus according to the present invention.
Figure 10A:
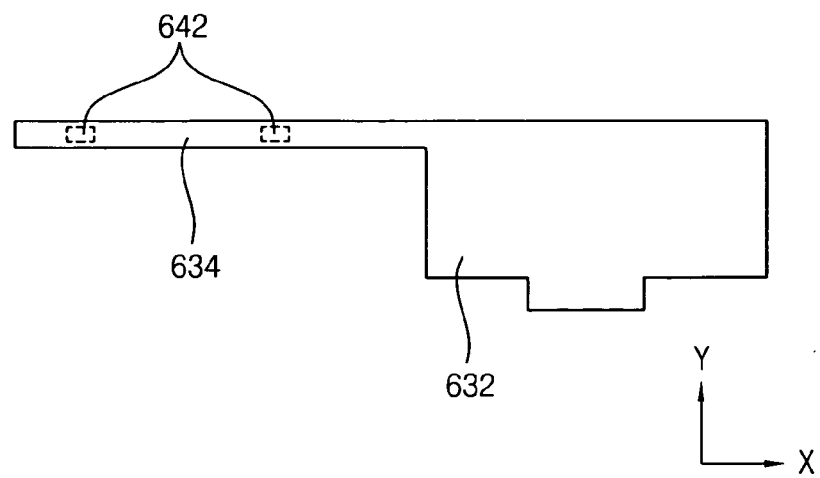
FIG. 10A is a plan view showing an exemplary embodiment of a hybrid FPC in FIG. 9.
Figure 10B:
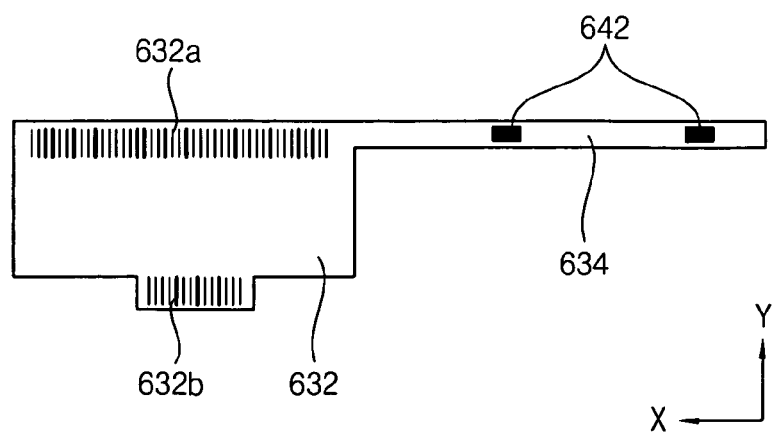
FIG. 10B is a rear view showing the hybrid FPC in FIG. 10A.

FIG. 9 is an exploded perspective view showing an exemplary embodiment of a display apparatus according to the present invention. FIG. 10A is a plan view showing a hybrid FPC in FIG. 9. FIG. 10B is a rear view showing the hybrid FPC in FIG. 10A. Particularly, FIG. 9 shows a hybrid FPC attached to a left side portion of a display panel.

Referring to FIGS. 9, 10A and 10B, a display apparatus 600 includes the display panel 110, the light guiding plate 120, the hybrid FPC 630 and a receiving container 650. In FIGS. 7, 8A and 8B, the same reference numerals denote the same elements in FIG. 1, and thus any further repetitive descriptions of the same elements will be omitted.

The hybrid FPC 630 includes a main portion 632 and a sub portion 634.

The main portion 632 is attached to a lower portion of the array substrate 112 via the FOG bonding process, and applies an electrical signal generated by the control PCB (not shown) to the driving chip 112b through the first conductive line 112a. The control PCB is disposed on a rear surface of the receiving container 650. The hybrid FPC 630 may be electrically connected to the control PCB via a soldering process or the ACF bonding process. In alternative exemplary embodiments, the hybrid FPC 630 may be electrically connected to the control PCB via a connector that is disposed on the control PCB. In other exemplary embodiments, at least one driving chip may be mounted on the main portion 632 to generate the electric signal applied to the display panel 110.

As shown in FIG. 10B, the main portion 632 has a first pad portion 632a and a second pad portion 632b that are formed on a rear surface of the main portion 632. The first pad portion 632a is electrically connected to the array substrate 112, and the second pad portion 632b is electrically connected to the control PCB.

At least one light emitting device 642 is mounted on the sub portion 634 to supply light to the light guiding plate 120.

The receiving container 650 has a sidewall and a supporting portion extended from a bottom portion of the sidewall toward an inside of the receiving container 650. The light guiding plate 120 and the display panel 110 are received in a receiving space that is formed by the sidewall and the supporting portion. At least one hole 652 is formed through the supporting portion, and the at least one light emitting device 642 mounted on the hybrid FPC 630 is inserted into the at least one hole 652.

The receiving container 650 has a first receiving portion 654 formed on a path through which the main portion 632 of the hybrid FPC 630 passes and a second receiving portion 656 formed on a path through which the sub portion 634 of the hybrid FPC 630 passes. The first receiving portion 654 is formed by partially removing a side portion of the sidewall of the receiving container 650 corresponding to the main portion 632, and the second receiving portion 656 is formed by partially removing a left side portion of the sidewall corresponding to the sub portion 634.

The first receiving portion 654 guides a receiving position of the main portion 632 bent to the control PCB disposed on the rear surface of the receiving container 650, and the second receiving portion 656 guides a receiving position of the sub portion 634 bent to the rear surface of the receiving container 650.

FIG. 9 shows the receiving container 650 having the first and second receiving portions 654 and 656 is formed to guide the main and sub portions 632 and 634. In alternative exemplary embodiments, the display apparatus 600 may not require both the first and second receiving portions 654 and 656. As the main portion 632 is bent to the rear surface of the receiving container 650, it covers a portion of a side of the display panel 110. As the sub portion 634 is bent to the rear surface of the receiving container 650, it covers a portion of a left side of the display panel 110. In other exemplary embodiments, the main portion 632, the sub portion 634 or both may also be disposed adjacent to the light incident surface of the light guide plate 120 as they are bent to the rear surface of the receiving container 650.

In an exemplary embodiment, the sub FPC with the light emitting device is directly attached to the display panel and electrically connected to the main FPC via the conductive line formed on the display panel, thereby advantageously not requiring a process of soldering or connecting the sub FPC to the main FPC.

In another exemplary embodiment, the liquid crystal display apparatus may include the hybrid type FPC into which the main FPC and the sub FPC are integrated. Advantageously, the process of soldering or connecting the sub FPC to the main FPC may not be required, such that a connection defect between the main FPC and the sub FPC may be reduced or essentially prevented.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display apparatus comprising:
   a display panel;
   a light guiding unit disposed adjacent to a first side of the display panel;
   a receiving container which receives the light guiding unit, and includes a first sidewall longitudinally extended in a first direction, and a second sidewall longitudinally extended in a second direction which is different than the first direction;
   a main flexible printed circuit board (FPC) electrically connected to a second side of the display panel to apply an electrical signal to the display panel;
   a sub FPC electrically connected to the main FPC; and
   a light emitting device to generate light supplied to the light guiding unit, the light emitting device being mounted on the sub FPC,
   wherein
   the display panel comprises a conductive line electrically connecting the main FPC with the sub FPC,
   the receiving container comprises a first receiving portion to receive the main FPC and a second receiving portion to receive the sub FPC,
   the first receiving portion extends into the first sidewall at a first portion of the first sidewall of the receiving container corresponding to the main FPC,
   the second receiving portion extends into the first sidewall at a second portion of the first sidewall of the receiving container corresponding to the sub FPC,
   the first receiving portion is adjacent to the second receiving portion in the first direction,
   the first receiving portion is separated from the second receiving portion in the first direction, and
   the first sidewall further comprises a third portion between the first and second receiving portions of the first side wall.

2. The display apparatus of claim 1, wherein the sub FPC is bent along the main FPC so that a second end of the sub FPC is disposed adjacent to a light incident portion of the light guiding unit, and
   the main and sub FPCs cover a portion of a side end of the display panel.

3. The display apparatus of claim 1, wherein the display panel comprises:
   an array substrate;
   an opposite substrate opposite to the array substrate; and
   a liquid crystal layer interposed between the array substrate and the opposite substrate.

4. The display apparatus of claim 1, further comprising an anisotropic conductive film electrically connecting the main FPC with the display panel.

5. A display apparatus comprising:
   a liquid crystal display panel;
   a light guiding unit disposed under the display panel;
   a receiving container to receive the light guiding unit, the receiving container including a first sidewall longitudinally extended in a first direction, and a second sidewall longitudinally extended in a second direction which is different than the first direction; and
   an FPC electrically connected to the liquid crystal display panel via a film on glass (FOG) bonding process, the FPC comprising:
   a main portion on which at least one driving chip is mounted to apply an electrical signal to the liquid crystal display panel; and
   a sub portion on which at least one light emitting device is mounted to generate light supplied to the light guide unit,
   wherein
   the receiving container comprises a first receiving portion to receive the main portion of the FPC, and a second receiving portion to receive the sub portion of the FPC,
   the first receiving portion extends into the first sidewall at a first portion of the first sidewall of the receiving container corresponding to the main portion FPC,
   the second receiving portion extends into the first sidewall at a second portion of the first sidewall of the receiving container corresponding to the sub portion FPC,
   the first receiving portion is adjacent to the second receiving portion in the first direction,
   the first receiving portion is separated from the second receiving portion in the first direction, and
   the first sidewall further comprises a third portion between the first and second receiving portions of the first side wall.

\* \* \* \* \*